(12) United States Patent
Yang (10) Patent No.: US 12,132,031 B2
(45) Date of Patent: Oct. 29, 2024

(54) DISPLAY PANEL AND MANUFACTURING METHOD OF DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Chaoqun Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/623,225

(22) PCT Filed: Dec. 20, 2021

(86) PCT No.: PCT/CN2021/139727
§ 371 (c)(1),
(2) Date: Dec. 27, 2021

(87) PCT Pub. No.: WO2023/108685
PCT Pub. Date: Jun. 22, 2023

(65) Prior Publication Data
US 2024/0030194 A1 Jan. 25, 2024

(30) Foreign Application Priority Data
Dec. 14, 2021 (CN) .......................... 202111529147.6

(51) Int. Cl.
*H01L 25/075* (2006.01)
*H01L 33/50* (2010.01)
*H01L 33/58* (2010.01)

(52) U.S. Cl.
CPC .......... *H01L 25/0753* (2013.01); *H01L 33/50* (2013.01); *H01L 33/58* (2013.01);
(Continued)

(58) Field of Classification Search
None
See application file for complete search history.

(56) References Cited

U.S. PATENT DOCUMENTS

| | | | |
|---|---|---|---|
| 2017/0133357 A1* | 5/2017 | Kuo | ...................... H01L 25/167 |
| 2018/0301665 A1 | 10/2018 | Sakamoto | |
| 2019/0013495 A1 | 1/2019 | Kim | |
| 2021/0005845 A1 | 1/2021 | Kim | |

FOREIGN PATENT DOCUMENTS

| | | |
|---|---|---|
| CN | 102347418 A | 2/2012 |
| CN | 106684108 A | 5/2017 |

(Continued)

OTHER PUBLICATIONS

Machine-generated English translation of CN 113394351 (Year: 2021).*

(Continued)

*Primary Examiner* — Bo B Jang
(74) *Attorney, Agent, or Firm* — PV IP PC; Wei Te Chung (57) ABSTRACT

The embodiment of the present application provides a display panel and a manufacturing method thereof. The display panel comprises a light-emitting device layer, a first optical structure layer, a second optical structure layer and an anti-reflection layer. The light-emitting device layer comprises light-emitting diodes and a retaining wall. The second optical structure layer is filled in the opening areas. Meanwhile, a refractive index of the second optical structure layer is greater than a refractive index of the first optical structure layer. The light extraction rate and display effect are (Continued)

improved with the optical structure layers with different refractive indexes and the retaining wall.

20 Claims, 8 Drawing Sheets

(52) U.S. Cl.
CPC ............... *H01L 2933/0041* (2013.01); *H01L 2933/0058* (2013.01); *H01L 2933/0091* (2013.01)

(56) References Cited

FOREIGN PATENT DOCUMENTS

| | | | |
|---|---|---|---|
| CN | 111653683 | A | 9/2020 |
| CN | 111834544 | A | 10/2020 |
| CN | 113013310 | A | 6/2021 |
| CN | 113130616 | A | 7/2021 |
| CN | 113178529 | A | 7/2021 |
| CN | 113394351 | A | 9/2021 |
| CN | 113568080 | A | 10/2021 |
| CN | 113629206 | A | 11/2021 |
| KR | 20210081603 | A | 7/2021 |

OTHER PUBLICATIONS

Machine-generated English translation of CN 111834544 (Year: 2020).*
International Search Report in International application No. PCT/CN2021/139727, mailed on Sep. 2, 2022.
Written Opinion of the International Search Authority in International application No. PCT/CN2021/139727, mailed on Sep. 2, 2022.
Chinese Office Action issued in corresponding Chinese Patent Application No. 202111529147.6 dated Mar. 28, 2024, pp. 1-9.

* cited by examiner

DISPLAY PANEL AND MANUFACTURING METHOD OF DISPLAY PANEL

FIELD OF THE INVENTION

The present application relates to the technical field of manufacturing display panels and display devices, and more particular to a display panel and a manufacturing method of the display panel.

BACKGROUND OF THE INVENTION

With the development of flexible display technology, people have put forward higher requirements for the quality and performance of the display panel.

Micro light emitting diode (Micro LED) is a new generation of display technology. Compared with the existing organic light emitting diode (OLED) technology, it possesses higher brightness, better luminous efficiency and lower power. In addition, MicroLED also possesses the characteristics of self-illumination without the backlight, and possesses the advantages of energy saving, simple structure, small size, and thin profile. It is another display technology with advantages of lightness, thinness and power saving after OLED. Therefore, MicroLED display technology has received more and more attention in recent years. However, as a new technology, MicroLED still faces many technical challenges. For instance, the preparation process is complicated and the prepared MicroLED display panel still has certain defects in light extraction efficiency and display effect, and cannot achieve the best light extraction efficiency, which is not conducive to the improvement of the overall performance of the display panel.

Therefore, it is necessary to propose solutions to the problems in the prior art.

In conclusion, the MicroLED display panel prepared in the prior art still has certain defects in the preparation process and device performance. For instance, the light extraction rate of the light in the display panel is low, and the display effect is not ideal, which is not conducive to the improvement to the comprehensive performance of the display panel.

SUMMARY OF THE INVENTION

In order to solve the foregoing problems, the embodiments of the present application provide a MicroLED display panel, which can effectively improve the problems of the low light extraction rate of the existing devices and the unsatisfactory display effect of the panel.

In order to solve the above technical problems, the technical methods provided in the embodiments of the present application are as follows:

First, the embodiment of the present application provides a display panel, comprising:
a substrate;
a light-emitting device layer, wherein the light-emitting device layer is disposed on the substrate, and the light-emitting device layer comprises light-emitting diodes arranged in an array, and a retaining wall disposed between two adjacent light-emitting diodes;
a first optical structure layer, wherein the first optical structure layer is disposed on the light-emitting device layer, and the first optical structure layer comprises a plurality of opening areas, and the opening areas are arranged corresponding to the light-emitting diodes;
a second optical structure layer, wherein the second optical structure layer is disposed on the first optical structure layer and fills the opening areas, wherein a refractive index of the second optical structure layer is greater than a refractive index of the first optical structure layer; and
an anti-reflection layer, wherein the anti-reflection layer is disposed on the second optical structure layer.

According to one embodiment of the present application, light-absorbing particles and light-diffusing particles are arranged in the retaining wall.

According to one embodiment of the present application, the light-absorbing particles comprise carbon black particles or organic black particles.

According to one embodiment of the present application, the light-diffusing particles comprise at least one of $TiO_2$ and $ZrO_2$.

According to one embodiment of the present application, a particle diameter of the light-diffusing particles is 100 nm to 300 nm.

According to one embodiment of the present application, a height of the retaining wall is not greater than a height of the light-emitting diodes.

Second, the embodiment of the present application provides a display panel, comprising:
a substrate;
a light-emitting device layer, wherein the light-emitting device layer is disposed on the substrate, and the light-emitting device layer comprises light-emitting diodes arranged in an array, and a retaining wall disposed between two adjacent light-emitting diodes;
a first optical structure layer, wherein the first optical structure layer is disposed on the light-emitting device layer, and the first optical structure layer comprises a plurality of opening areas, and the opening areas are arranged corresponding to the light-emitting diodes;
a second optical structure layer, wherein the second optical structure layer is disposed on the first optical structure layer and fills the opening areas, wherein a refractive index of the second optical structure layer is greater than a refractive index of the first optical structure layer; and
an anti-reflection layer, wherein the anti-reflection layer is disposed on the second optical structure layer.

According to one embodiment of the present application, light-absorbing particles and light-diffusing particles are arranged in the retaining wall.

According to one embodiment of the present application, the light-absorbing particles comprise carbon black particles or organic black particles.

According to one embodiment of the present application, the light-diffusing particles comprise at least one of $TiO_2$ and $ZrO_2$.

According to one embodiment of the present application, a particle diameter of the light-diffusing particles is 100 nm to 300 nm.

According to one embodiment of the present application, the refractive index of the first optical structure layer is 1.1 to 1.5, and the refractive index of the second optical structure layer is greater than 1.6.

According to one embodiment of the present application, the display panel further comprises a filter layer disposed between the second optical structure layer and the anti-reflection layer, and the filter layer comprises black matrix layers arranged at intervals and color resist layers arranged between the black matrix layers, and the color resist layers are disposed corresponding to the opening areas.

According to one embodiment of the present application, a height of the retaining wall is not greater than a height of the light-emitting diodes.

According to one embodiment of the present application, the first optical structure layer further comprises non-opening areas, the non-opening areas and the opening areas are spaced apart, and a cross-sectional shape of the corresponding first optical structure layer in the non-opening area is a trapezoid or an arc.

According to one embodiment of the present application, an angle formed between the trapezoid and a surface of the light-emitting device layer is 30° to 50°.

According to one embodiment of the present application, a thickness of the second optical structure layer is greater than or equal to a thickness of the first optical structure layer.

According to one embodiment of the present application, a width of the opening areas is greater than or equal to a width of the corresponding light-emitting diodes.

According to one embodiment of the present application, a surface reflectance of the anti-reflection layer is less than 6%.

Third, the embodiment of the present application further provides a manufacturing method of a display panel, comprising steps of:
  providing a substrate,
  preparing and forming retaining walls on the substrate, and the retaining walls are disposed on the substrate at intervals;
  disposing light-emitting diodes between adjacent retaining walls, and planarizing the retaining walls and the light-emitting diodes to form a light-emitting device layer;
  preparing and forming a first optical structure layer on the light-emitting device layer, and preparing a second optical structure layer on the first optical structure layer, wherein the first optical structure layer comprises open areas and non-open areas, and the opening areas are arranged corresponding to the light-emitting diodes, and the second optical structure layer is filled in the opening areas, and a refractive index of the first optical structure layer is different from a refractive index of the second optical structure layer;
  preparing and forming a filter layer on the light-emitting device layer, and preparing and forming an anti-reflection layer on the filter layer;
  preparing a protective layer on the anti-reflection layer and completing preparation of the display panel.

In conclusion, the benefits of the embodiments of the present application are:
  the embodiment of the present application provides a display panel and a manufacturing method of the display panel. The display panel comprises a light-emitting device layer, a first optical structure layer, a second optical structure layer and an anti-reflection layer. The light-emitting device layer comprises light-emitting diodes and a retaining wall arranged between the light-emitting diodes.

The second optical structure layer is filled in the opening areas. Meanwhile, the refractive index of the second optical structure layer is different from the refractive index of the first optical structure layer. The light extraction rate and display effect are improved with the optical structure layers with different refractive indexes and the retaining wall.

DETAILED DESCRIPTION OF PREFERRED EMBODIMENTS

Besides, the following descriptions for the respective embodiments are specific embodiments capable of being implemented for illustrations of the present invention with referring to appended figures.

With the continuous development of display panel manufacturing technology, people have put forward higher requirements on the performance and quality of the display panel. It is hoped that the prepared display panel does not only possess better quality, but also possesses better overall performance.

For the MicroLED display panel, it possesses the characteristics of self-illumination without backlight, and possesses the advantages of energy saving, simple structure, small size and thin profile, and is widely used in various light-emitting display devices. However, as preparing high-performance MicroLED devices in the prior art, the preparation process still has certain technical bottlenecks, and the prepared panels still have the problems of low light extraction efficiency and unsatisfactory light-emitting display performance.

In the embodiment of the present application, a display panel and a manufacturing method of the display panel are further provided to improve the manufacturing process of the panel and effectively improve the light extraction efficiency and comprehensive performance of the micro light-emitting diode display panel.

Figure 1:
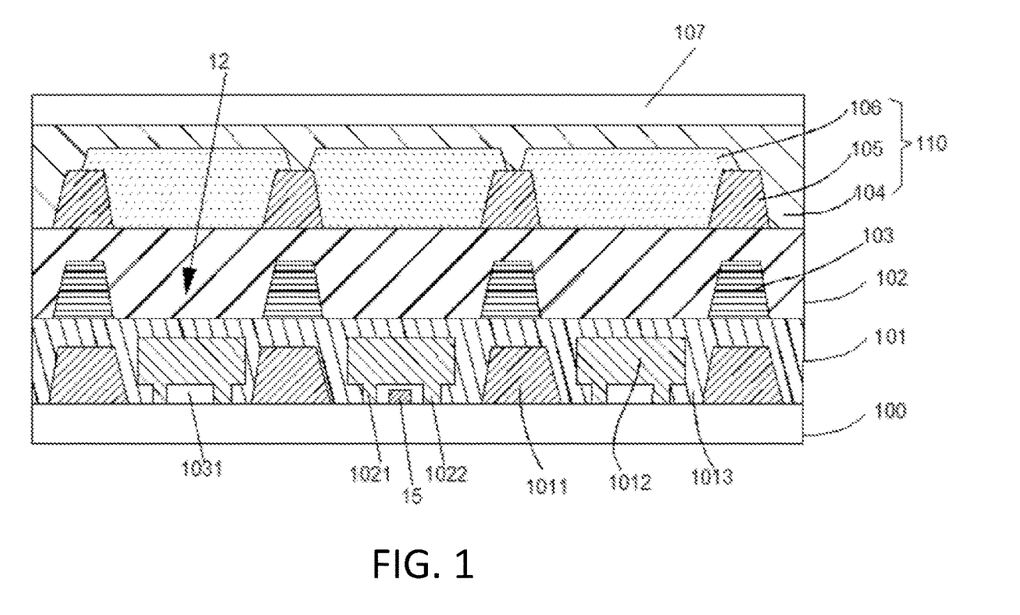
FIG. 1 is a film structural diagram of a display panel provided by an embodiment of the application.

Specifically, as shown in FIG. 1, FIG. 1 is a film structural diagram of a display panel provided by an embodiment of the application. The display panel provided in the embodiment of the present application comprises: a substrate 100, a light-emitting device layer 101, a first optical structure layer 103 and a second optical structure layer 102. The light-emitting device layer 101 is disposed on the substrate 100. The first optical structure layer 103 is disposed on the light-emitting device layer 101. The second optical structure layer 102 is disposed on the light-emitting device layer 101 and the first optical structure layer 103.

Specifically, in the embodiment of the present application, when the light-emitting device layer 101 is disposed, the light-emitting device layer 101 comprises a plurality of light-emitting diodes 1012 and a retaining wall 1011. The plurality of light-emitting diodes 1012 are arranged in an array on the substrate 100. The plurality of light-emitting diodes 1012 are arranged in an array on the substrate 100 to effectively improve the display brightness of the display panel.

In the embodiment of the present application, the light-emitting diodes 1012 are arranged at intervals. Specifically, the plurality of light-emitting diodes 1012 may be arranged in a matrix array or other predetermined arrangements, and meanwhile, the retaining wall 1011 is further arranged between two adjacent light-emitting diodes 1012. The retaining wall 1011 is arranged between any two adjacent light-emitting diodes 1012, and the structure of the retaining wall 1011 is arranged to effectively improve the light-emitting effect of the display panel.

Specifically, the light-emitting diode 1012 in the embodiment of the present application comprises a cathode 1021 and an anode 1022 which are arranged on two sides. There is a gap 1031 between the cathode 1021 and the anode 1022, and the gap 1031 is provided to prevent the problem of short circuit between the two electrodes of the light-emitting diode 1012.

Furthermore, in the embodiment of the present application, a barrier structure 15 can be further provided in the gap 1031, and the barrier structure 15 can be provided to improve the performance of the light-emitting diode.

When the retaining wall 1011 is arranged, the height of the retaining wall 1011 is not greater than the height of the light-emitting diodes 1012 arranged on both sides, so as to minimize the blocking of the light emitted by the light-emitting diode 1012 by the retaining wall 1011. Meanwhile, the light-emitting device layer 101 further comprises a filling layer 1013. The filling layer 1013 planarizes the retaining wall 1011 and the light-emitting diode 1012 and fills the gaps between the respective devices. Ultimately, the light-emitting device layer in the embodiment of the present application is formed. In the embodiment of the present application, the filling layer 1013 may be an inorganic material to prevent short circuit of two adjacent light-emitting diodes 1012.

Meanwhile, the retaining wall 1011 structure provided in the embodiment of the present application can be configured as a black retaining wall to absorb part of the visible light and reduce the reflected light. Specifically, light-absorbing particles and light-diffusing particles may be arranged in the retaining wall 1011.

Figure 2:
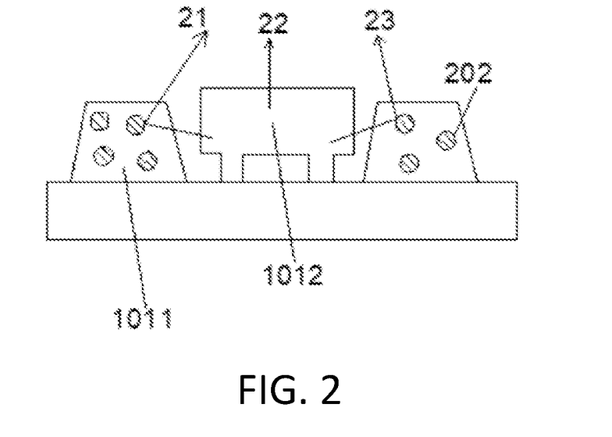
FIG. 2 to FIG. 3 are diagrams of the effect of the retaining wall and the light-emitting diode on the light provided by the embodiment of the application.
Figure 3:
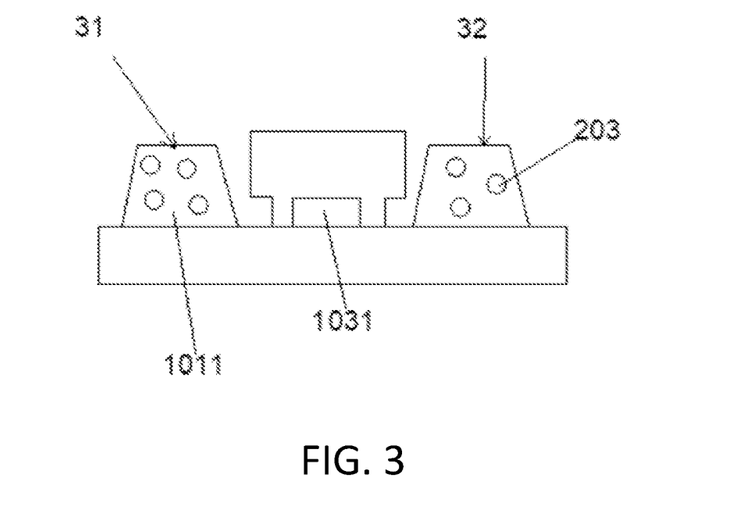

As shown in FIG. 2 to FIG. 3, FIG. 2 to FIG. 3 are diagrams of the effect of the retaining wall and the light-emitting diode on the light provided by the embodiment of the application. Referring to FIG. 2 for details, the light 21, 22 and 23 is emitted by the light-emitting diode 1012. Since the light-diffusing particles 202 are arranged in the retaining wall 1011, when the light 21 and the light 23 pass through the retaining wall 1011 and come to the light-diffusing particles 202 inside the retaining wall 1011, the particles can further scatter light since the particles are light-diffusing particles. As shown in FIG. 2, part of the light 21 and the light 22 entering the retaining wall 1011 are scattered to the outside of the retaining wall 1011, thereby improving the light extraction efficiency of the light.

As shown in FIG. 3, when external light enters the display panel, it will have a certain impact to the performance of the device. In the embodiment of the present application, light-absorbing particles 203 are further provided in the retaining wall 1011. When the external light 31 and the light 32 enter the retaining wall 1011, they are absorbed by the light-absorbing particles 203, thereby reducing the influence of external light on the light-emitting diode 1012, and effectively improving the performance of the panel.

Specifically, in the embodiment of the present application, the light-absorbing particles 203 and the light-diffusing particles 202 can be uniformly distributed in the retaining wall 1011, and the concentration of the aforesaid particles can be adjusted according to the luminous intensity of the light-emitting diode 1012. The specific concentration will not be described in detail here. Meanwhile, the light-absorbing particles 203 provided in the embodiments of the present application may comprise carbon black particles or black particles formed of other organic or inorganic materials. The light-diffusing particles 202 provided in the embodiments of the present application may be spherical particles.

In the embodiment of the present application, the light-diffusing particles 202 may comprise at least one of $TiO_2$ and $ZrO_2$, or other particles possessing scattering effect on light. In order to ensure the effect of the light-diffusing particles 202, a particle diameter of the light-diffusing particles 202 in the embodiment of the present application is 100 nm to 300 nm.

Furthermore, in the embodiment of the present application, when the retaining wall 1011 is arranged, the thickness of the retaining wall 1011 is greater than 5 μm, and meanwhile, the width of the retaining wall 1011 is greater than 0.5 μm. Preferably, the reflectance of the retaining wall 1011 is greater than 60%. Therefore, it can ensure the performance of the retaining wall 1011.

With reference to FIG. 1, when the first optical structure layer 103 and the second optical structure layer 102 are provided in the embodiment of the present application, the first optical structure layer 103 is patterned and arranged on the light-emitting device layer 101. The first optical structure layer 103 comprises a plurality of opening areas 12 and non-opening areas provided on sides of the opening areas. The first optical structure layer 103 forms a solid structure in the non-opening areas, such as a trapezoidal solid optical structure in FIG. 1. In the embodiment of the present application, as arranging the opening areas 12, the opening areas 12 are arranged opposite to the light-emitting diodes 1012, and the cross-sectional area corresponding to the opening area 12 can be in various shapes. The cross-sectional shape in FIG. 1 is a trapezoidal opening, and can also be a rectangular opening or an arc opening.

Meanwhile, in the embodiment of the present application, as arranging the width of the opening area 12, the width of the opening area 12 is greater than or equal to the width of the corresponding light-emitting diode 1012. When the width of the opening area 12 is greater than the width of the light-emitting diode 1012, the difference between the two is 3 μm to 5 μm. Therefore, the light can be emitted from the opening area 12 completely.

Furthermore, as arranging the first optical structure layer 103, the sidewall of the first optical structure layer 103 on the side facing the opening area 12 possesses a slope, that is, there is an included angle between the first optical structure layer 103 and the surface of the light-emitting device layer 101. The included angle is the slope of the first optical structure layer 103, and the included angle is between 30° and 45°. By arranging the slope, the forward light extraction of the light-emitting diode at the bottom can be effectively increased.

In the embodiment of the present application, the second optical structure layer 102 fills the opening area 12 and covers the first optical structure layer 103. Furthermore, the refractive index of the first optical structure layer 103 is different from the refractive index of the second optical structure layer 102. Preferably, the refractive index of the second optical structure layer 102 is greater than the refractive index of the first optical structure layer 103. Thus, the first optical structure layer 103 and the second optical structure layer 102 form a low refractive index-high refractive index structure. When the light emitted by the light-emitting diode sequentially passes through different optical structure layers, the light extraction rate of the light is effectively improved.

Preferably, the refractive index of the first optical structure layer 103 is 1.1 to 1.5, and the refractive index of the second optical structure layer 102 is greater than 1.6. Preferably, as arranging the first optical structure layer 103 and the second optical structure layer 102, the difference between the refractive index of the second optical structure layer and the refractive index of the first optical structure layer is greater than or equal to 0.2. Thus, the light possesses a higher light extraction rate after passing through the first optical structure layer 103 and the second optical structure layer 102.

Figure 4:
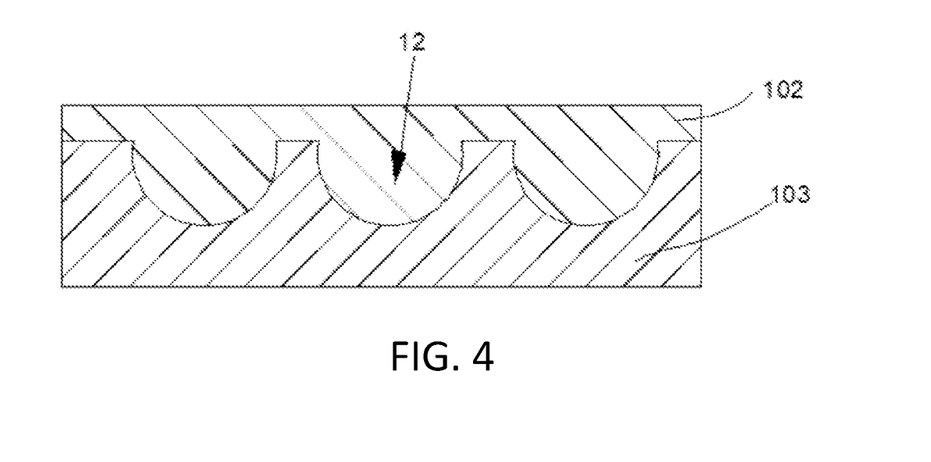
FIG. 4 is a structural diagram of an optical structure layer provided by an embodiment of the application.

As shown in FIG. 4, FIG. 4 is a structural diagram of an optical structure layer provided by an embodiment of the application. In the embodiment of the present application, the cross-sectional shape of the opening area 12 of the first optical structure layer 103 is configured as an arc shape, specifically, it may be a semicircular structure. The second optical structure layer 102 is filled in the semicircular structure. Preferably, the second optical structure layer 102 can only fill the opening area 12, or fill the opening area and completely covers the first optical structure layer 103. When the second optical structure layer 102 covers the first optical structure layer 103, the height of the covered part can be configured to be 5 μm to 20 μm.

Preferably, the structure corresponding to the opening area 12 of the first optical structure layer 103 can also be configured as other shapes. It can be configured according to specific products, and ensure that the first optical structure layer 103 and the second optical structure layer 102 have different refractive indexes.

Furthermore, as shown in FIG. 1, the display panel in the embodiment of the present application further comprises a filter layer 110. The filter layer 110 is disposed on the second optical structure layer 102. Specifically, the filter layer 110 comprises black matrix layers 105, an optical adhesive layer 104 and color resist layers 106.

As arranging the respective film structures corresponding to the filter layer 110, the black matrix layers 105 are patterned on the second optical structure layer 102, and the pixel opening area and the pixel non-opening area are formed. The black matrix layers 105 are correspondingly arranged in the non-opening areas of the pixels. The color resist layers 106 are correspondingly arranged in the opening areas formed by the black matrix layers 105. Meanwhile, the optical adhesive layer 104 is disposed on the color resist layers 106 and covers the black matrix layers 105 and the color resist layers 106 to ultimately form the filter layer 110 of the display panel.

In the embodiment of the present application, as arranging the filter layer 110, The optical reflectance corresponding to the filter layer 110 is less than 6%, and the thickness is configured to be between 4 μm and 7 μm.

Furthermore, as arranging the color resist layers 106, the color resist layers 106 can comprise red color resists, blue color resists and green color resists. The color resist layer materials of different colors are correspondingly arranged in different opening areas, and two adjacent color resist layers of different colors are not connected, thereby effectively ensuring that the display panel is not prone to problems such as color mixing.

Specifically, as arranging the black matrix layers 105, the thickness of the black matrix layers 105 is configured to be between 1 μm and 3 μm. The width of the corresponding black matrix layers 105 in each non-display area is greater than 1 μm, so as to prevent the problem of color mixing between two adjacent color resist layers. At the same time, the corresponding film thickness of the red color resist layer, the blue color resist layer and the green color resist layer is configured to be between 1 μm and 4 μm. Furthermore, the width of the color resist layers of different colors arranged in each opening area is not less than the width of the corresponding light-emitting diode.

Furthermore, the display panel in the embodiment of the present application further comprises an anti-reflection layer 107. The anti-reflection layer 107 is disposed on the second optical structure layer 102. Specifically, the anti-reflection layer 107 is disposed on the filter layer 110. In the embodiment of the present application, in order to further improve the light-emitting effect of the display panel, the reflectance of the upper surface of the anti-reflection layer 107 is less than 6%.

Figure 5:
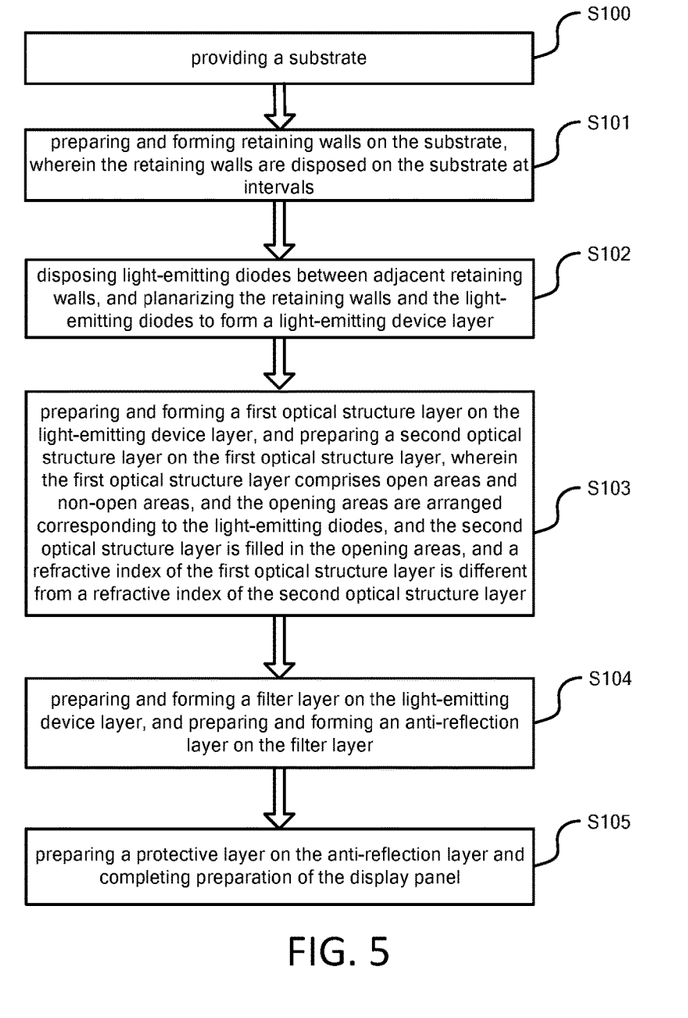
FIG. 5 is a flowchart of a manufacturing process of a display panel provided by an embodiment of the application.

Furthermore, the embodiment of the present application further provides a manufacturing method of a display panel. As shown in FIG. 5, FIG. 5 is a flowchart of a manufacturing process of a display panel provided by an embodiment of the application. The method comprises step of:

S100: providing a substrate;

S101: preparing and forming retaining walls on the substrate, wherein the retaining walls are disposed on the substrate at intervals;

S102: disposing light-emitting diodes between adjacent retaining walls, and planarizing the retaining walls and the light-emitting diodes to form a light-emitting device layer;

S103: preparing and forming a first optical structure layer on the light-emitting device layer, and preparing a second optical structure layer on the first optical structure layer, wherein the first optical structure layer comprises open areas and non-open areas, and the opening areas are arranged corresponding to the light-emitting diodes, and the second optical structure layer is filled in the opening areas, and a refractive index of the first optical structure layer is different from a refractive index of the second optical structure layer;

S104: preparing and forming a filter layer on the light-emitting device layer, and preparing and forming an anti-reflection layer on the filter layer;

S105: preparing a protective layer on the anti-reflection layer and completing preparation of the display panel.

Specifically, As shown in FIG. 6 to FIG. 14, FIG. 6 to FIG. 12 are diagrams of the corresponding film structure of the display panel provided by the embodiment of the application in different processes.

Figure 6:
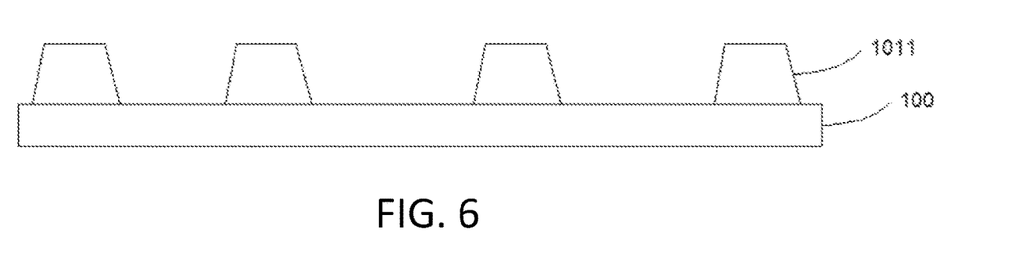
FIG. 6 to FIG. 12 are diagrams of the corresponding film structure of the display panel provided by the embodiment of the application in different processes.

As shown in FIG. 6, providing a substrate 100, and preparing and forming retaining walls 1011 on the substrate 100. In the embodiment of the present application, the retaining walls 1011 are arranged in an array on the substrate 100, and there is an opening area between two adjacent retaining walls 1011.

Figure 7:
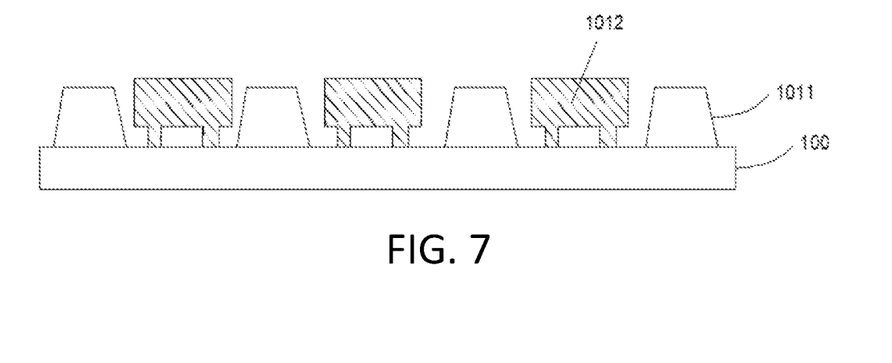

After arranging of the retaining walls 1011 is completed, a massive amount of light-emitting diodes are transferred and bonded to the substrate 100. As shown in FIG. 7, specifically, the massive amount of light-emitting diodes 1012 are transferred in the opening areas among the retaining walls 1011. During the transferring and bonding process, a certain distance is reserved between the retaining wall 1011 and the light-emitting diode 1012.

In the embodiment of the present application, the process of arranging the retaining walls 1011 and the process of transferring the massive amount of light-emitting diodes 1012 are interchangeable. For instance, the massive amount of light-emitting diodes 1012 is transferred on the substrate, and then the retaining walls 1011 are prepared and formed in the corresponding positions.

In the embodiment of the present application, as arranging the retaining walls 1011, the retaining walls 1011 possess the function of absorbing and reflecting part of the light. Specifically, the light-diffusing particles 202 are arranged in the retaining wall 1011. When the light emitted by the light-emitting diode 1012 passes through the retaining wall 1011, part of the light will be diffused again by the light-diffusing particles in the retaining wall 1011, thereby achieving the effect of further improving the light extraction rate of the display panel. Meanwhile, the light-absorbing particles are further provided in the retaining wall 1011. When the external light enters the display panel, it is absorbed by the light-absorbing particles, thereby reducing the problem of light reflection of the display panel and effectively improving the display quality and effect of the display panel.

Figure 8:
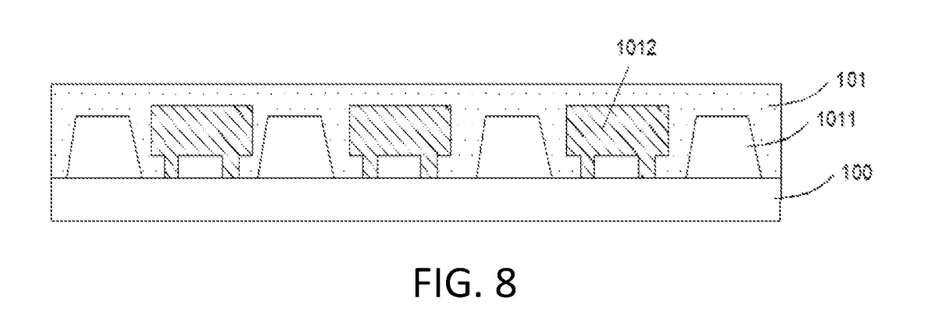
Figure 9:
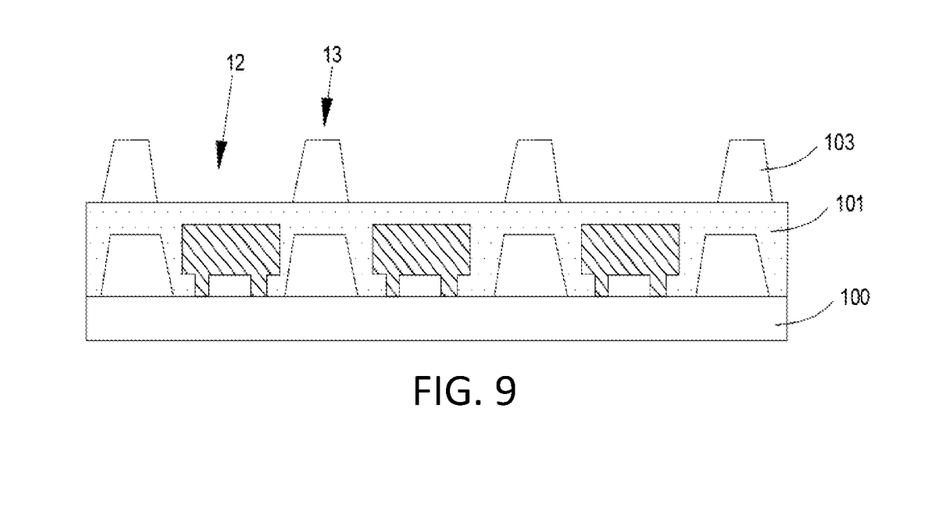

As shown in FIG. 8 and FIG. 9, After the retaining wall and the light-emitting diode are prepared, the retaining wall 1011 and the light-emitting diode 1012 are encapsulated, and the light-emitting device layer 101 is formed. In order to ensure the performance of the light-emitting device layer 101, when the light-emitting device layer 101 is encapsulated, the gap among the retaining walls 1011 and the light-emitting diodes 1012 is filled, and the encapsulation has a certain height. Ultimately, the light-emitting device layer 101 provided in the embodiment of the present application is formed.

After the preparation of the light-emitting device layer 101 is completed, the first optical structure layer 103 is prepared on the light-emitting device layer 101. As disposing the first optical structure layer 103, the first optical structure layer 103 is patterned so that the first optical structure layer 103 forms opening areas 12 and non-aperture areas. The opening area 12 corresponds to the light-emitting diode, and the non-opening area 13 corresponds to the retaining wall structure.

Figure 10:
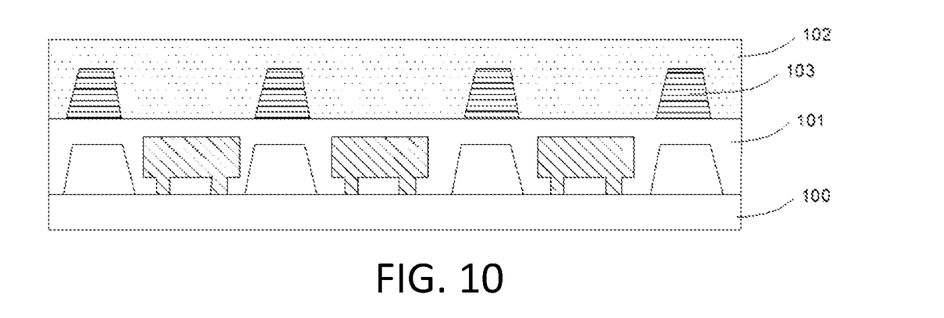
Figure 11:
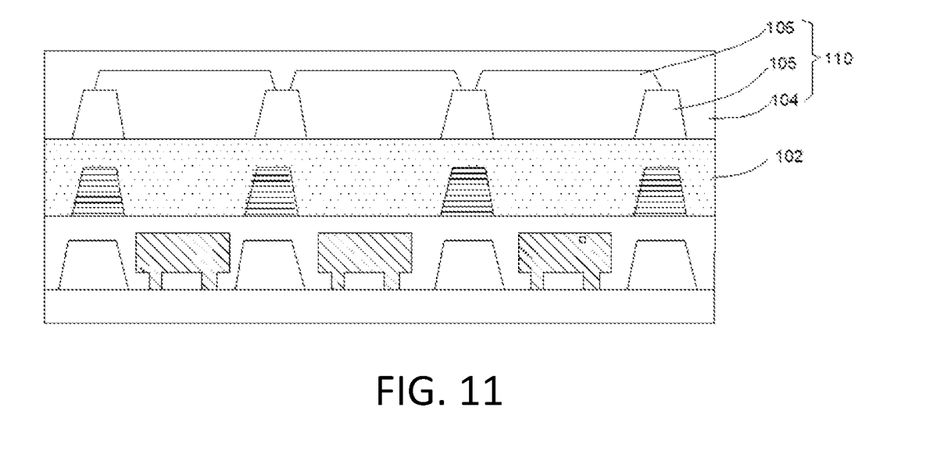

Furthermore, as shown in FIG. 10 and FIG. 11, in the embodiment of the present application, after the first optical structure layer 103 is prepared, continue to prepare and form the second optical structure layer 102. When the second optical structure layer 102 is prepared and formed, the second optical structure layer 102 is filled in the opening area 12. Meanwhile, after the filling is completed, the thickness of the second optical structure layer 102 is the same as the thickness of the first optical structure layer 103, or the thickness of the second optical structure layer 102 is greater than the thickness of the first optical structure layer 103. When the two thicknesses are the same, only the second optical structure layer 102 is required to fill the corresponding opening area. When the thickness of the second optical structure layer 102 is greater than the thickness of the first optical structure layer 103, the second optical structure layer 103 does not only need to fill the corresponding opening area, but also needs to possess a certain thickness, and the thickness of the excess part can be 5 µm to 20 µm. It completely cover the first optical structure layer 103, and ultimately form the film structure as shown in FIG. 10.

The optical refractive index of the first optical structure layer 103 and the optical refractive index of the second optical structure layer 102 provided in the embodiment of the present application are different. Preferably, the refractive index of the first optical structure layer 103 is less than the refractive index of the second optical structure layer 102. When the light emitted by the light-emitting diode passes through the film layers with different refractive indexes, more light can be emitted, thereby effectively improving the light extraction rate of the emitted light.

After the preparation of the light structure layer is completed, as shown in FIG. 11, continue to prepare and form the filter layer. Specifically, as preparing the filter layer, the black matrix layer 105 is first prepared. The black matrix layers 105 are patterned and disposed on the second optical structure layer 102, and the opening areas formed by the black matrix layers 105 correspond to the opening areas formed by the first optical structure layer 103 in a one-to-one correspondence.

Specifically, in the embodiment of the present application, as disposing the black matrix layers 105, the film layer thickness of the black matrix layers 105 is configured to be between 1 µm to 3 µm, and the width of the black matrix layer 105 between two adjacent opening regions is greater than 1 µm, so as to ensure the blocking effect of the black matrix layers 105 on the light.

After the preparation of the black matrix layers 105 is completed, color resist layers are disposed in the opening areas formed by the black matrix layers 105. In the embodiment of the present application, the color resist layers are arranged in the opening areas between the black matrix layers 105, and at the same time, the thickness of the color resist layers 106 is configured to be between 1 µm-4 µm. Furthermore, the color resist layers 106 provided by the embodiment of the present application comprise red color resists, blue color resists and green color resists. The color resist layers of different colors are correspondingly arranged in different opening areas.

Furthermore, the black matrix layers 105 and the color resist layers 106 are encapsulated, such as encapsulated with the optical adhesive layer 104, to ultimately form the filter layer 110 in the embodiment of the present application.

Figure 12:
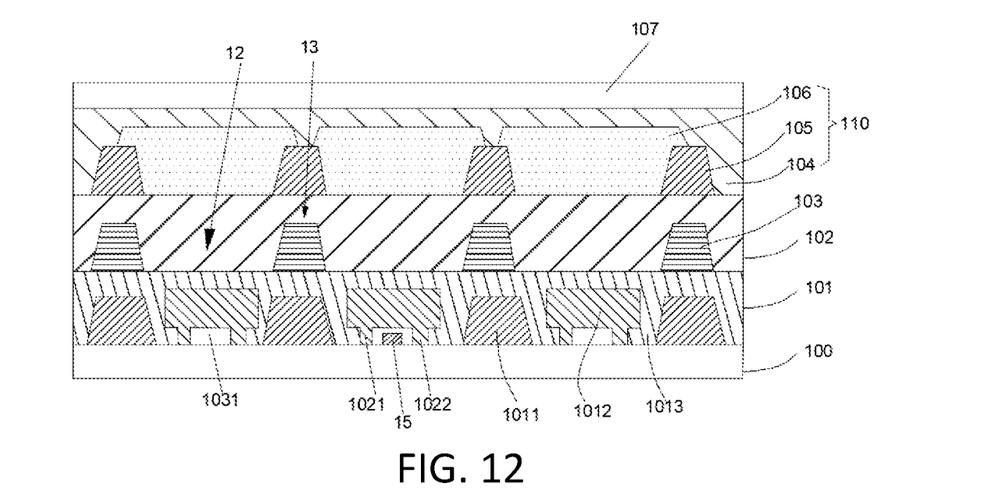

Specifically, as shown in FIG. 12, FIG. 12 is a film structural diagram of a display panel provided by an embodiment of the application. After the filter layer 110 is prepared, an anti-reflection layer 107 is prepared on the filter layer 110, and a protective layer can be prepared on the anti-reflection layer 107 to complete the preparation of the display panel. In the embodiment of the present application, the light-emitting diode is arranged at a corresponding position in the pixel opening area 12, and the retaining wall 1011 is arranged at a corresponding position in the non-opening area 13. Specifically, the reflectance of the upper surface of the anti-reflection layer is less than 6%, thereby effectively reducing the reflection of external light, and improving the display effect of the display panel.

Figure 13:
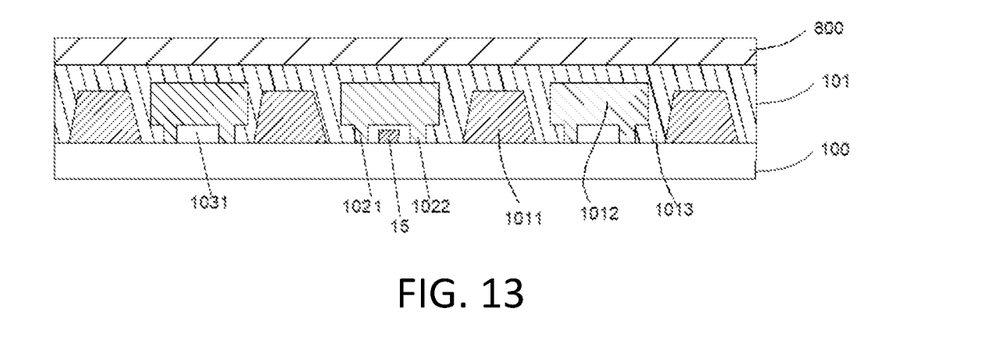
FIG. 13 to FIG. 14 are diagrams of the film layers of the display panel provided in the embodiments of the application.
Figure 14:
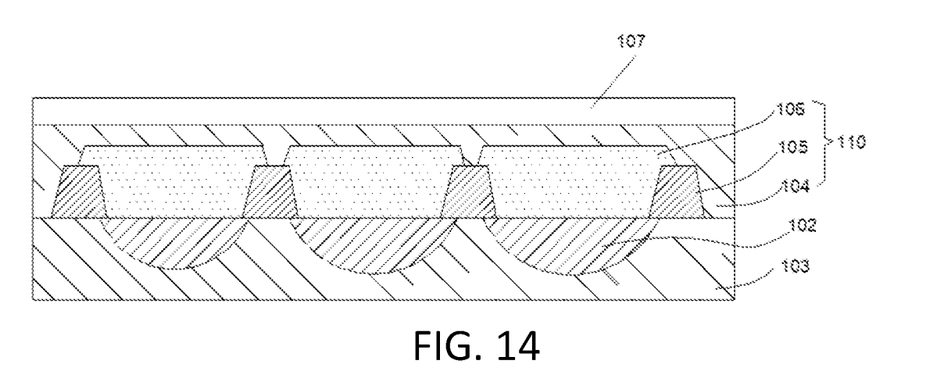

In the embodiment of the present application, as preparing and forming the display panel, the assembling and cell process can also be implemented. Specifically, as the film structures shown in FIG. 13 to FIG. 14, FIG. 13 to FIG. 14 are diagrams of the film layers of the display panel provided in the embodiments of the application. In the embodiment of the present application, the multiple film layers are separately arranged, and then the multiple film layers are combined. After the combination is completed, the assembling is implemented, and ultimately, the display panel in the embodiment of the present application is formed.

Specifically, first, the substrate 100 and the light-emitting device layer 101 are prepared according to the aforesaid preparation process. After the preparation is completed, the substrate 100 and the light-emitting device layer 101 are combined to form a first module.

The first optical structure layer 103, the second optical structure layer 102, the filter layer 110 and the anti-reflection layer 107 are prepared, and the aforesaid film layers are sequentially combined according to the method in the embodiment of the present application to form the second module.

Then, an adhesive layer 800 is prepared on the combined surface of the first module or the second module. The adhesive layer 800 can be a commonly used thermo curing material. For instance, the adhesive layer 800 will be cured at a high temperature. The curing temperature of the adhesive layer 800 is 230° C.

The first module and the second module are adhered through the adhesive layer 800, and ultimately the display panel provided in the embodiment of the present application is formed.

Furthermore, the embodiment of the present application further provides a display device. The display device comprises the display panel, and the display panel is prepared by the manufacturing method in the embodiment of the present application. The display device possesses a better light extraction rate and a better display effect.

The display panel and the manufacturing method provided by the embodiments of the present application is described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. A display panel, comprising:
   a substrate;
   a light-emitting device layer, wherein the light-emitting device layer is disposed on the substrate, and the light-emitting device layer comprises light-emitting diodes arranged in an array, and a retaining wall disposed between two adjacent light-emitting diodes;
   a first optical structure layer, wherein the first optical structure layer is disposed on the light-emitting device layer, and the first optical structure layer comprises a plurality of opening areas, and the opening areas are arranged corresponding to the light-emitting diodes;
   a second optical structure layer, wherein the second optical structure layer is disposed on the first optical structure layer and fills the opening areas, wherein a refractive index of the second optical structure layer is greater than a refractive index of the first optical structure layer, and a difference between the refractive index of the second optical structure layer and the refractive index of the first optical structure layer is greater than or equal to 0.2; and
   an anti-reflection layer, wherein the anti-reflection layer is disposed on the second optical structure layer;
   wherein the light-emitting device layer further comprises a filling layer, and an unfilled gap between a cathode and an anode of each of the light-emitting diodes; the filling layer fills another gap between the light-emitting diode and the retaining wall, and planarizes the remaining wall and the light-emitting diode; and the unfilled gap is provided with a barrier structure.

2. The display panel according to claim 1, wherein light-absorbing particles and light-diffusing particles are arranged in the retaining walls.

3. The display panel according to claim 2, wherein the light-absorbing particles comprise carbon black particles or organic black particles.

4. The display panel according to claim 2, wherein the light-diffusing particles comprise at least one of $TiO_2$ and $ZrO_2$.

5. The display panel according to claim 4, wherein a particle diameter of the light-diffusing particles is 100 nm to 300 nm.

6. The display panel according to claim 1, wherein a height of the retaining wall is not greater than a height of the light-emitting diodes.

7. A display panel, comprising:
   a substrate;
   a light-emitting device layer, wherein the light-emitting device layer is disposed on the substrate, and the light-emitting device layer comprises light-emitting diodes arranged in an array, and a retaining wall disposed between two adjacent light-emitting diodes;
   a first optical structure layer, wherein the first optical structure layer is disposed on the light-emitting device layer, and the first optical structure layer comprises a plurality of opening areas, and the opening areas are arranged corresponding to the light-emitting diodes;
   a second optical structure layer, wherein the second optical structure layer is disposed on the first optical structure layer and fills the opening areas, wherein a refractive index of the second optical structure layer is greater than a refractive index of the first optical structure layer; and
   an anti-reflection layer, wherein the anti-reflection layer is disposed on the second optical structure layer;
   the light-emitting device layer further comprises a filling layer, and an unfilled gap between a cathode and an anode of each of the light-emitting diodes; the filling layer fills another gap between the light-emitting diode and the retaining wall, and planarizes the remaining wall and the light-emitting diode; and the unfilled gap is provided with a barrier structure.

8. The display panel according to claim 7, wherein light-absorbing particles and light-diffusing particles are arranged in the retaining wall.

9. The display panel according to claim 8, wherein the light-absorbing particles comprise carbon black particles or organic black particles.

10. The display panel according to claim 8, wherein the light-diffusing particles comprise at least one of $TiO_2$ and $ZrO_2$.

11. The display panel according to claim 10, wherein a particle diameter of the light-diffusing particles is 100 nm to 300 nm.

12. The display panel according to claim 7, wherein the refractive index of the first optical structure layer is 1.1 to 1.5, and the refractive index of the second optical structure layer is greater than 1.6.

13. The display panel according to claim 7, wherein the display panel further comprises a filter layer disposed between the second optical structure layer and the anti-reflection layer, and the filter layer comprises black matrix layers arranged at intervals and color resist layers arranged between the black matrix layers, and the color resist layers are disposed corresponding to the opening areas.

14. The display panel according to claim 7, wherein a height of the retaining wall is not greater than a height of the light-emitting diodes.

15. The display panel according to claim 7, wherein the first optical structure layer further comprises non-opening areas, the non-opening areas and the opening areas are spaced apart, and a cross-sectional shape of the corresponding first optical structure layer in the non-opening areas is a trapezoid or an arc.

16. The display panel according to claim 15, wherein an angle formed between the trapezoid and a surface of the light-emitting device layer is 30° to 50°.

17. The display panel according to claim 7, wherein a thickness of the second optical structure layer is greater than or equal to a thickness of the first optical structure layer.

18. The display panel according to claim 7, wherein a width of the opening areas is greater than or equal to a width of the corresponding light-emitting diodes.

19. The display panel according to claim 7, wherein a surface reflectance of the anti-reflection layer is less than 6%.

20. A manufacturing method of a display panel, comprising steps of:

providing a substrate;

preparing and forming retaining walls on the substrate, and the retaining walls are disposed on the substrate at intervals;

forming a barrier structure between adjacent retaining walls, disposing a cathode and an anode of a corresponding one of light-emitting diodes at two sides of the barrier structure respectively, and planarizing the retaining walls and the light-emitting diodes to form a light-emitting device layer with an unfilled gap between the cathode and the anode;

preparing and forming a first optical structure layer on the light-emitting device layer, and preparing a second optical structure layer on the first optical structure layer, wherein the first optical structure layer comprises opening areas and non-opening areas, and the opening areas are arranged corresponding to the light-emitting diodes, and the second optical structure layer is filled in the opening areas, and a refractive index of the first optical structure layer is different from a refractive index of the second optical structure layer;

preparing and forming a filter layer on the light-emitting device layer, and preparing and forming an anti-reflection layer on the filter layer;

preparing a protective layer on the anti-reflection layer and completing preparation of the display panel.

\* \* \* \* \*